United States Patent [19]

Backwinkel

[11] 3,789,262

[45] Jan. 29, 1974

[54] SAWTOOTH SCAN CIRCUIT WITH HOLD FEATURE

[75] Inventor: Johannes Backwinkel, Hildesheim, Germany

[73] Assignee: Blaupunkt-Werke GmbH, Hildesheim, Germany

[22] Filed: Sept. 11, 1972

[21] Appl. No.: 287,754

[30] Foreign Application Priority Data

Sept. 22, 1971 Germany ........................... 2147228

[52] U.S. Cl. ............. 315/27 TD, 307/238, 324/470

[51] Int. Cl. ............................................ H01j 29/70

[58] Field of Search .................... 325/422, 470, 469; 315/27–29; 328/181–185; 307/238

[56] References Cited

UNITED STATES PATENTS

| | | | |
|---|---|---|---|
| 3,467,870 | 9/1969 | Aoyama | 325/470 |
| 3,575,661 | 4/1971 | Slavik | 325/470 |
| 3,560,858 | 2/1971 | Sakai et al. | 325/470 |
| 3,706,041 | 12/1972 | Krausser | 325/470 |

*Primary Examiner*—Maynard R. Wilbur
*Assistant Examiner*—J. M. Potenza
*Attorney, Agent, or Firm*—Flynn and Frishauf

[57] ABSTRACT

A gas discharge tube isolates the storage condenser of a sawtooth wave generator of an electronic tuning device from the pulses that charge it up and, more rapidly, discharge it in a scanning cycle. A first electronic switch grounds a clamping diode to reverse the polarity of the pulses and thus discharge the storage condenser. A second electronic switch provides a hold function by reducing the amplitude of the charging pulses (taken from a TV line scanning flyback circuit) so that they cannot fire the gas discharge tube.

16 Claims, 2 Drawing Figures

SAWTOOTH SCAN CIRCUIT WITH HOLD FEATURE

Cross-reference to related patent: U.S. Pat. No. 3,568,065; to related application: Ser. No. 251,101 filed May 10, 1972.

This invention relates to a sawtooth wave scan circuit with a holding feature for use in a signal search circuit especially useful for television receivers.

In television receivers, especially the portable kind, an automatic tuning function for searching and finding a setting at which a station is received is often desired. Especially when the set is taken on a trip such a function greatly facilitates the tuning of a station.

The scanning function for such automatic tuning may be provided by a motor or electronically, as is already known. In the case of electronic scanning, it is required to provide a tuning voltage on the form of a sawtooth wave to the tuning diodes of an electronically controlled tuner, and in this case when a signal has been found it is necessary to provide a stop signal in such a way as to hold the momentary value of the tuning voltage from that moment on. The known circuit systems for electronic tuning are not adapted to store or preserve a tuning setting because the sawtooth wave generators that have been used do not have a storage or hold feature.

It is an object of this invention to provide a sawtooth wave generator with an automatic hold feature.

SUBJECT MATTER OF THE PRESENT INVENTION

Briefly, scanning pulses, readily available in the case of television receivers from the flyback portion of the line scanning circuit, are arranged to charge a storage condenser through a resistance-capacitance network, gradually increasing its charge from a minimum to a maximum value. The voltage across the capacitor is used to generate a proportional voltage in a low impedance circuit from which a tuner may readily be controlled. This is accomplished by a voltage follower circuit using a field effect transistor with its gate electrode connected to the storage capacitor. A voltage discriminator bistable switch means, which may be a semiconductor controlled switch, is operated by the output of the voltage follower circuit. It is triggered into one of its stable states when the storage capacitor reaches the predetermined maximum value and into the other stable state when the storage capacitor reaches a predetermined minimum value. This bistable output is used to operate a first electronic switch that provides a discharge path for the storage capacitor. The scanning pulses are provided by a resistance-capacitance network to the storage capacitor through a voltage threshold breakdown device, which may be gas discharge tube, a feature which requires that the pulses must have a peak voltage equal to or greater than the breakdown voltage of the device if they are to add anything to the charge on the storage capacitor. A second electronic switch is provided to modify the resistance-capacitance network so as to reduce the peak voltage of the scanning pulses when the receiver under control provides a hold or stop signal as a result of a station being tuned in. While the hold signal is present, the scanning pulses are blocked from the storage capacitor by the voltage threshold breakdown device so tha the output of the voltage follower then remains steady.

The hold signal can be filtered so that it will persist during brief absences of the signal being tuned in or it may be provided with the assistance of a bistable device that will lock up the hold signal and prevent the resumption of scanning until a manual reset button has been actuated, or until a range switch has been changed in position, or the like.

An output of the voltage discriminator bistable switch means is preferably utilized to block the operation of a second electronic switch while the first electronic switch is operated, that is, to prevent a hold signal from being effective during the restart interval of the scanning wave, while the storage condenser is rapidly discharging. The discharge path is preferably made to include the voltage threshold breakdown device thus improving the longevity of the stored tuning voltage. To accomplish this, a diode is provided in series with the first electronic switch so that its clamping action will cause the scan pulses to produce negative pulses through the voltage threshold breakdown device which will discharge the storage capacitor.

An illustrative embodiment of the invention will be more particularly described with reference to the accompanying drawing in which.

Figure 1:
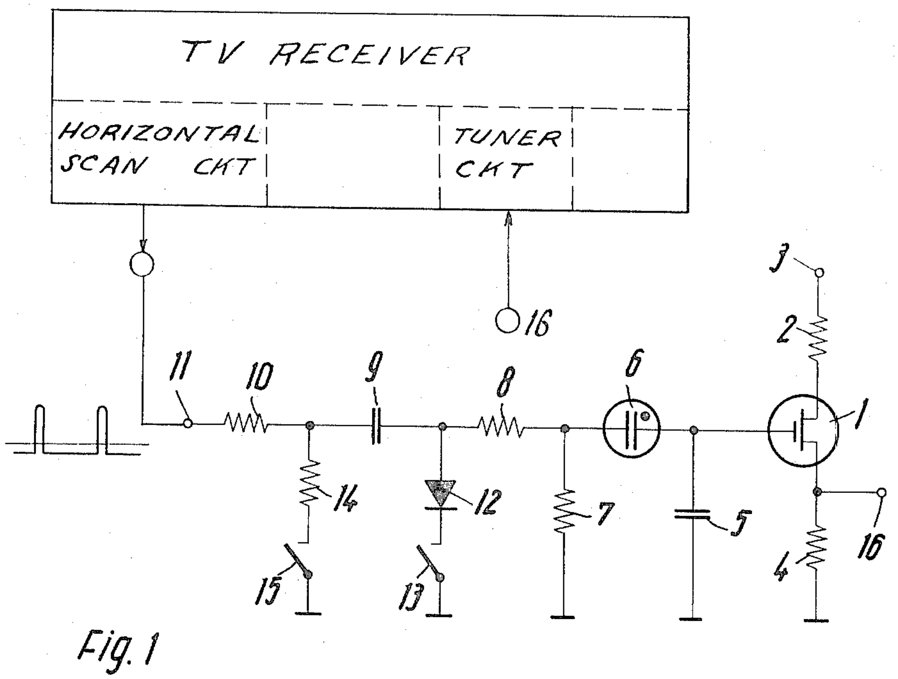
FIG. 1 is a basic circuit diagram.

FIG. 1 shows a field effect transistor 1 with its drain electrode connected through a resistor 2 to a supply 3 of tuning control voltage and with its source electrode connected to ground through a resistor 4. The gate electrode of field effect transistor 1 is connected to a storage capacitor 5, the other electrode of which is grounded, and to a gas discharge tube 6 the other electrode of which is connected to ground through a high resistance 7. The electrode of the gas discharge tube 6 which is connected with resistor 7 is connected witha series combination of resistor 8, capacitor 9 and resistor 10 to a terminal 11 which represents a connection to a source of scanning pulses, which in the case of a television receiver would be a connection to the line scanning circuits suitable for deriving a positive pulse on every flyback pulse of the horizontal scanning of the television receiver.

The terminal of capacitor 9 which is on the gas discharge tube side of the capacitor as it is connected in the resistance-capacitance network is also connected to a diode 12, the other terminal of which is connected to a first electronic switch 13, the other side of which is grounded. The other terminal of capacitor 9 is connected over a resistor 14 to a second electronic switch 15 which is likewise grounded.

OPERATION

Line flyback pulses of positive polarity are supplied to terminal 11 which slowly charge up capacitor 5 over resistor 10, capacitor 9 resistor 8 and gas discharge tube 6. This charging of capacitor 5 is gradual and, because of the vary small steps succeeding each other reapidly (at the line scanning frequency of the receiver), practically linear, thus forming the main portion of a sawtooth wave. Concurrently the voltage at the source electrode of the field effect transisotr 1 shanges proportionally to the voltage on storage capacitor 5. The circuit of field effect transistor 1 may be referred to as a voltage follower circuit since it furnishes voltage proportional to that on its gate electrode that may be taken off at low impedance from the output terminal 16 and provided to an electronic turning circuit. When the rising voltage on terminal 16 reaches a first predetermined value, which is the maximum for the tuning range in question, the first electronic switch 13 will be closed. The rate at which the predetermined maximum value is reached depends upon the electrical magnitudes of capacitor 5, and resistances 7, 8 and 10, the breakdown voltage of gas discharge tube 6 and the amplitude and duration of the impulses furnished at terminal 11.

When electronic switch 13 is closed, diode 12 grounds resistor 8 for positive signals, clamping the positive peaks of the scanning pulses to ground so that the negative going portions of these pulses will now discharge capacitor 5. Since the pulse width is much greater during this discharge operation than in the case of charging, the discharge time is also very much shorter, thus giving the sawtooth wave the desired shape. When a second predetermined voltage, the minimum voltage for the tuning range in question, is reached, the electronic switch 13 is re-opened the charging of storage capacitor 5 begins anew. Capacitor 9 has a relatively high capacitance and therefore has little influence on the rise time of the sawtooth wave. For the rise or advance portion of the scanning cycle, a period of a few seconds has been found suitable, and for the return portion of the cycle a period of a fraction of a second is easily obtained in this manner.

If during the advance portion of the scanning cycle a station is tuned in, a second electronic switch 15 is closed under control of a disconnect voltage. By this operation the effective scanning pulse voltage is divided in the proportion ($R$ 14 /$R$ 10 + $R$ 14). The voltage thus divided is smaller than the ignition voltage of the gas discharge tube. Consequently no further charging of storage capacitor 5 takes place. It follows that the voltage at terminal 16 is then likewise kept substantially constant and depends upon the magnitude of storage capacitor 5, the input resistance of field effect transistor 1 and the insulation or leakage resistance of gas discharge tube 6 and of storage capacitor 5.

Figure 2:
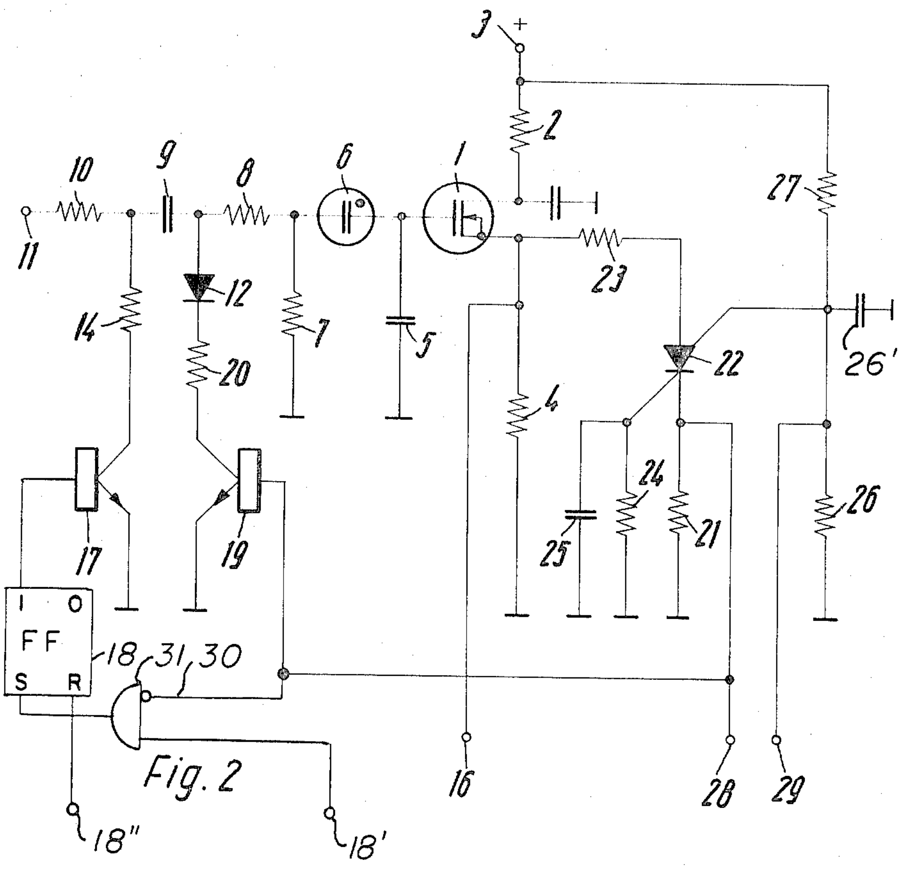
FIG. 2 shows in more detail a specific embodiment of the basic circuit of FIG. 1.

FIG. 2 shows in more detail a specific embodiment of the basic circuit of FIG. 1. Transistor 17 functions as the second electronic switch (15 in FIG. 1). Its base electrode is connected to a point in the apparatus being controlled where the hold signal can be provided. In the case of a television receiver, this may be received carrier signal. The circuit 18 illustrates the means for processing the hold signal. Means normally included in the receiver, such as a filter for causing the signal to persist for brief periods during which the received signal may dissappear may be suitable in some cases. A longer persistance memory circuit may, however, be desired and hence the circuit 18 is shown as a flipflop circuit that is set when a received signal appears at terminal 18' and is reset only when the tuning range is changed, when a manual button is operated, or on any one number of chosen convenient occasions, made effective by a voltage at terminal 18''. When the stop signal is furnished by circuit 18 to the base of transistor 17, the latter conducts, grounding resistor 14 with the effect previously described.

The first electronic switch 13 of FIG. 1 is similarly supplied by a transistor 19. Its emitter, like that of transistor 17, is grounded and its collector electrode is connected through a resistor 10 to the cathode of the diode 12. The base of transistor 19 is connected to the cathode of a semiconductor controlled switch 22, which is grounded over a resistor 21. The anode of semiconductor controlled switch 22 is connected over a resistor 23 to the source electrode of field effect transistor 1. The semiconductor controlled switch 22 is a four layer device with two control electrodes. This type of device is sometimes referred to as a thyristor tetrode. One of the control electrodes is used for turn on, the other for turn off. The cathode gate electrode is connected to ground over a parallel combination of resistor 27 and capacitor 25. The anode gate is connected to a voltage divider across the tuning voltage supply, resistor 26 being connected to ground, resistor 27 being connected to supply terminal 3 and their junction being connected to the anode gate of semiconductor controlled switch 22 as well as to a filter capacitor 26'.

Semiconductor controlled switch 22 serves to produce the control voltage for transistor 19 which constitutes the first electronic switch designated 13 in FIG. 1. When the voltage at the anode of semiconductor controlled switch 22 reaches that of its anode gate electrode, the semiconductor controlled switch is turned on and a positive voltage arises at its cathode which in turn turns on transistor 19. As storage capacitor 5 then discharges as previously described, the voltage at the anode of semiconductor controlled switch 22 will likewise fall and when it reaches a predetermined value, as determined in this case by the components of the cathode and the cathode gate circuit, in this case a relatively low positive voltage, semiconductor controlled switch 22 will be turned off and transistor 19 will thereby again be put in its blocking (turned off) condition.

Instead of a semiconductor controlled switch of the type described a transistor circuit could of course be used, as for example some from of Schmidt trigger circuit. Impulses may be obtained from terminal 28 or 29 or both to prevent the hold signal from having any effect during the return cycle of the scanning circuit, that is, while capacitor 5 is being discharged, as well as to turn off the sound or to darken the picture during that interval. Unless filter condenser 26' is very small, it will modify appreciably the pulse form available at terminal 29. The connection 30 and gate 31 indicate the function just discussed, the previously mentioned circuit 18 being appropriate location for temporarily, by known techniques, preventing a hold signal from being produced. Searching for a signal to tune in, accordingly, always takes place in one direction and that is advantageously arranged to be the direction going from sound carrier to picture carrier.

The invention has the particular advantage that the particular value of the tuning voltage may be held and preserved for long time. Not only will it be left undisturbed by an interruption of the transmitting signal but even turning off the receiver will produce no premature loss of the control voltage. The storage effect can stretch over several days. On turning the set on it is unnecessary to adjust the tuning anew for a station that has already been received before the set was last turned off.

The term "ground," as is common in the case of electronic circuits, can have the meaning of a stable reference potential, not appreciably varied by currents of the circuit thereto or therefrom, as well as the more common meaning of the equipment chassis or frame potential or the local earth or building structure potential.

Although the invention has been illustrated with a single example, it will be understood that changes and modifications may be made within the invention concept without departing from the spirit of the invention.

I claim:

1. A sawtooth scan circuit with memory hold feature comprising:
- a storage capacitor (5) having one terminal connected to ground;
- a high input impedance voltage follower circuit (1,2,4) having a low impedance output (16), the other terminal of the capacitor (15) being connected to the control terminal of the voltage follower circuit;
- scanning pulse means (11) continuously providing repetitively occurring pulses connected to said capacitor (5) for gradually charging said storage capacitor (5) by repeated small increments of a predetermined minimum magnitude;
- a voltage threshold breakdown device (6) connected in series between said storage capacitor (5) and said scanning pulse means for discriminatively supplying output pulses of said scanning means to said storage capacitor (5);
- a first electronic switch (13) for discharging said storage capacitor (5) when the output of said voltage follower circuit reaches a predetermined maximum value, and
- holding means including a second electronic switch (15) connected to attenuate said scanning pulses to a value insufficient to activate said voltage threshold breakdown device (6) and thereby to stop incrementally charging said capacitor (5) and thus to stop said scanning cycle in response to a hold signal supplied by an apparatus whose function is controlled or modified by the output of said voltage follower circuit.

2. A sawtooth scan circuit as defined in claim 1 in which:
- said voltage follower circuit comprises a field effect transistor (1);
- a voltage discriminator bistable switch means (22) is provided, adapted to turn on said first electronic switch (13) when a predetermined maximum output voltage is attained by said voltage follower circuit and also to turn off said first electronic switch (13) when the output of said voltage follower circuit reaches a predetermined minimum value;
- said second electronic switch (15) is a transistor and a bypass adapted to ground said scanning pulses in response to a hold signal.

3. A sawtooth scan circuit as defined in claim 2 in which the discharge path (6,8,12,20,13) of said storage capacitor (5) includes a series diode (12) in series between said first electronic switch (13) and said voltage threshold breakdown device. (6)

4. A sawtooth scan circuit as defined in claim 3 in which said voltage threshold breakdown device (6) is a gas discharge tube and in which said voltage discriminator bistable switch means (22) is a semiconductor controlled switch (SCS) having its anode gate electrode connected to a voltage divider fed by the power supply of the circuit.

5. A sawtooth scan circuit as defined in claim 3 in which a resistance-capacitance network, (7,8,9,10,14,20) is provided coupling the scanning pulse means (11) to the voltage threshold device (6), and includes a resistor (7) between ground and the pulse input side of said voltage threshold breakdown device (6).

6. A sawtooth scan circuit as defined in claim 5 in which said resistance-capacitance network (7,8,9,10,14,20) includes a series resistor (8) between said voltage threshold breakdown device and said coupling capacitor (9) and said series resistor (8) over other elements (12,20,19) of said discharge path to ground.

7. A sawtooth scan circuit as defined in claim 1 in which said scanning pulses are provided by flyback pulses of the line scanning circuit of a television receiver.

8. A sawtooth scan circuit as defined in claim 2 in which means are provided responsive to an output of said voltage discriminator bistable switch means (22) for preventing the operation of said holding means during discharge of the capacitor (5) by operation of said first electronic switch (13).

9. A sawtooth scan circuit as defined in claim 4 in which means are provided which are activated by a pulse formed either on the cathode of said semiconductor switch (22) or on the anode gate electrode thereof for disabling the application of a hold signal to said second electronic switch (15) during the period said first electronic switch (13) is closed.

10. A sawtooth scan circuit as defined in claim 1 in which said first and second electronic switches (13,15) are grounded emitter transistors (19,17).

11. Circuit as defined in claim 1 further comprising a resistance-capacitance network (7,8,9,10,14,20) to controllably couple the source of scanning pulses (11) to said voltage threshold breakdown device (6).

12. A sawtooth scan circuit as defined in claim 11 in which said second electronic switch (15) is adapted, when activated, to ground a shunt resistance (14) of said resistance-capacitance network (7,8,9,10,14,20) to form with a resistor (10) thereof, a voltage divider so designed that the scanning pulses supplied to the voltage threshold breakdown device (6) are of a peak voltage less than the breakdown voltage of said voltage threshold breakdown device (6).

13. Circuit as defined in claim 11 wherein
- said resistance-capacitance network has a series input resistor (10) connected between said source of scanning pulses (11) and the junction of a branch (14) connected to said second electronic switch (15) and further comprises a coupling capacitor (9), of greater capacitance than said storage capacitor (5), in the series path (10,9,8,6) of said network.

14. In a television receiver having
- a line scanning circuit, said line scanning circuit having fly back pulses appearing therein,
- an electronically controlled tuning circuit requiring a sawtooth wave voltage, and a memory hold feature to hold, in response to a command signal, the value of the sawtooth wave voltage at selected levels below the maximum level of the sawtooth wave voltage;

a sawtooth scan circuit with memory hold feature comprising a storage capacitor (5) having one terminal connected to ground;

a high impedance input voltage follower circuit (1,2,4) having a low impedance output (16) connected to the electronically controlled tuning circuit, the other terminal of the capacitor (15) being connected to the control terminal of the voltage follower circuit;

means (11) connecting the fly back pulses from the line scanning circuit to said capacitor (5) for gradually charging said storage capacitor by repeated small increments of a predetermined minimum magnitude, and including a voltage threshold breakdown device (6) connected in series between said storage capacitor (5) and said line scanning circuit for discriminatively supplying the flyback pulses to said storage capacitor (5);

a first electronic switch (13) for discharging said storage capacitor (5) when the output of said voltage follower circuit reaches a predetermined maximum value corresponding to the maximum value of the sawtooth ray voltage;

and holding means including a second electronic switch (15) connected to attenuate said fly back pulses to a value insufficient to activate said voltage threshold breakdown device (6) and thereby to stop incrementally charging said capacitor (5) and thus to stop said scanning cycle in response to the hold command signal supplied by the tuning circuit.

15. In the television receiver of claim 14, wherein said voltage follower circuit comprises a field effect transistor (1);

a voltage discriminator bistable switch means (22) is provided, adapted to turn on said first electronic switch (13) when a predetermined maximum output voltage is attained by said voltage follower circuit and also to turn off said first electronic switch (13) when the output of said voltage follower circuit reaches a predetermined minimum value;

said second electronic switch (15) is a transistor and a bypass adapted to ground said scanning pulses in response to a hold signal.

16. In the television receiver of claim 15, means responsive to an output of said voltage discriminator bystable switch means (22) to prevent operation of said holding means during discharge of the capacitor (5) by operation of said first electronic switch (13).

* * * * *